United States Patent
Chang et al.

(10) Patent No.: US 10,580,477 B2
(45) Date of Patent: Mar. 3, 2020

(54) CONTROL CIRCUIT AND CONTROL METHOD FOR CONTROLLING DELAY LOCK LOOP IN DYNAMIC RANDOM ACCESS MEMORY

(71) Applicant: Nanya Technology Corporation, New Taipei (TW)

(72) Inventors: Chuan-Jen Chang, Baoshan Township, Hsinchu County (TW); Wen-Ming Lee, Toufen (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 16 days.

(21) Appl. No.: 15/946,264

(22) Filed: Apr. 5, 2018

(65) Prior Publication Data
US 2019/0311761 A1 Oct. 10, 2019

(51) Int. Cl.
| | |
|---|---|
| *G11C 7/10* | (2006.01) |
| *G11C 11/4076* | (2006.01) |
| *G11C 11/409* | (2006.01) |
| *H03L 7/081* | (2006.01) |
| *H03L 7/093* | (2006.01) |
| *H03L 7/095* | (2006.01) |
| *H03L 7/085* | (2006.01) |
| *G11C 7/22* | (2006.01) |

(52) U.S. Cl.
CPC ........ *G11C 11/4076* (2013.01); *G11C 7/1066* (2013.01); *G11C 7/222* (2013.01); *G11C 11/409* (2013.01); *H03L 7/085* (2013.01); *H03L 7/0818* (2013.01); *H03L 7/093* (2013.01); *H03L 7/095* (2013.01)

(58) Field of Classification Search
CPC .................................................... G11C 7/1078
USPC ........................................................ 713/401
See application file for complete search history.

(56) References Cited

U.S. PATENT DOCUMENTS

2002/0157031 A1* 10/2002 Lin ...................... G11C 7/1078
713/401

* cited by examiner

*Primary Examiner* — Jason Lappas
(74) *Attorney, Agent, or Firm* — Birch, Stewart, Kolasch & Birch, LLP (57) ABSTRACT

A dynamic random access memory (DRAM) includes a delay lock loop (DLL), a clock tree, an off-chip driver (OCD), a phase detector (PD) and a filter. The DLL receives a reference clock and updates a delay line, and then outputs a calibrated clock via the clock tree; the PD receives the calibrated clock via the clock tree and detects a phase difference between the calibrated clock and the reference clock; and the filter activates the DLL to update the delay line according the phase difference, wherein when a READ command is received, the filter increases the number of activations for the DLL to update the delay line, thereby shortening the access time of the DRAM.

18 Claims, 8 Drawing Sheets

CONTROL CIRCUIT AND CONTROL METHOD FOR CONTROLLING DELAY LOCK LOOP IN DYNAMIC RANDOM ACCESS MEMORY

BACKGROUND

1. Technical Field

This present invention relates to a delay lock loop (DLL) in a dynamic random access memory (DRAM), and in particular relates to the controlling of the DLL in the dynamic random access memory when data is being accessed.

2. Description of Related Art

As CPU speeds continue to increase, memory performance becomes more of a limiting factor in system performance. An important aspect of increasing memory performance is increasing the speed at which data can be transmitted to and from DRAMs. In high-speed DRAM technologies such as RDRAM and DDR, a DLL is a circuit designed to minimize the phase difference between the reference clock (input clock) and the control signals.

Figure 1:
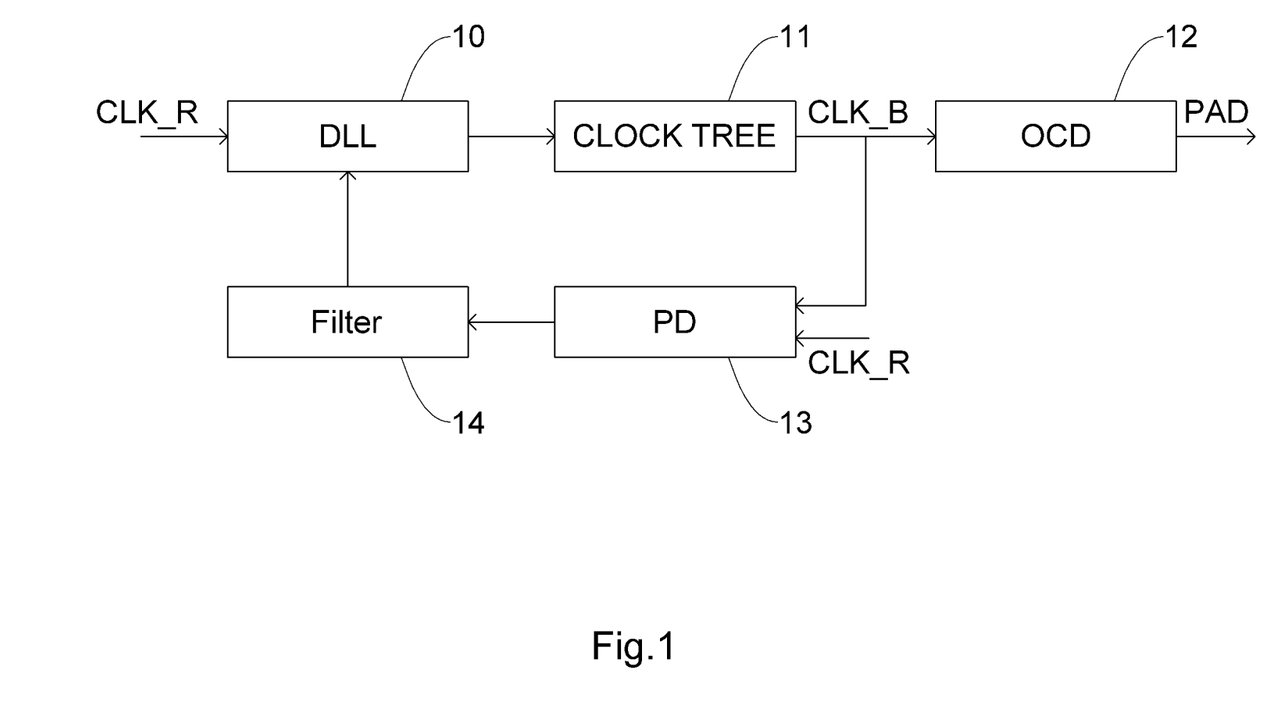
FIG. 1 illustrates a prior art control circuit for controlling the DLL in the DRAM.

FIG. 1 illustrates a prior art control circuit for controlling a DLL 10 in a DRAM. The DRAM includes the DLL 10, a clock tree 11, at least one off-chip driver (OCD) 12, a phase detector (PD) 13 and a filter 14. The DLL 10 receives a reference clock (CLK_R) and updates a delay line of the DLL 10, and then outputs a calibrated clock (CLK_B) via the clock tree 11 to at least one OCD 12, wherein the DRAM will follow the CLK_B to carry out the READ operation. The OCD 12 transmits the CLK_B to an external device via a PAD. The PD 13 receives the CLK_B via the clock tree 11 and detects a phase difference between the CLK_B and the CLK_R; thus, the PD 13 obtains the information that an edge of the CLK_B is ahead of, behind or synchronized with an edge of the CLK_R.

Figure 2:
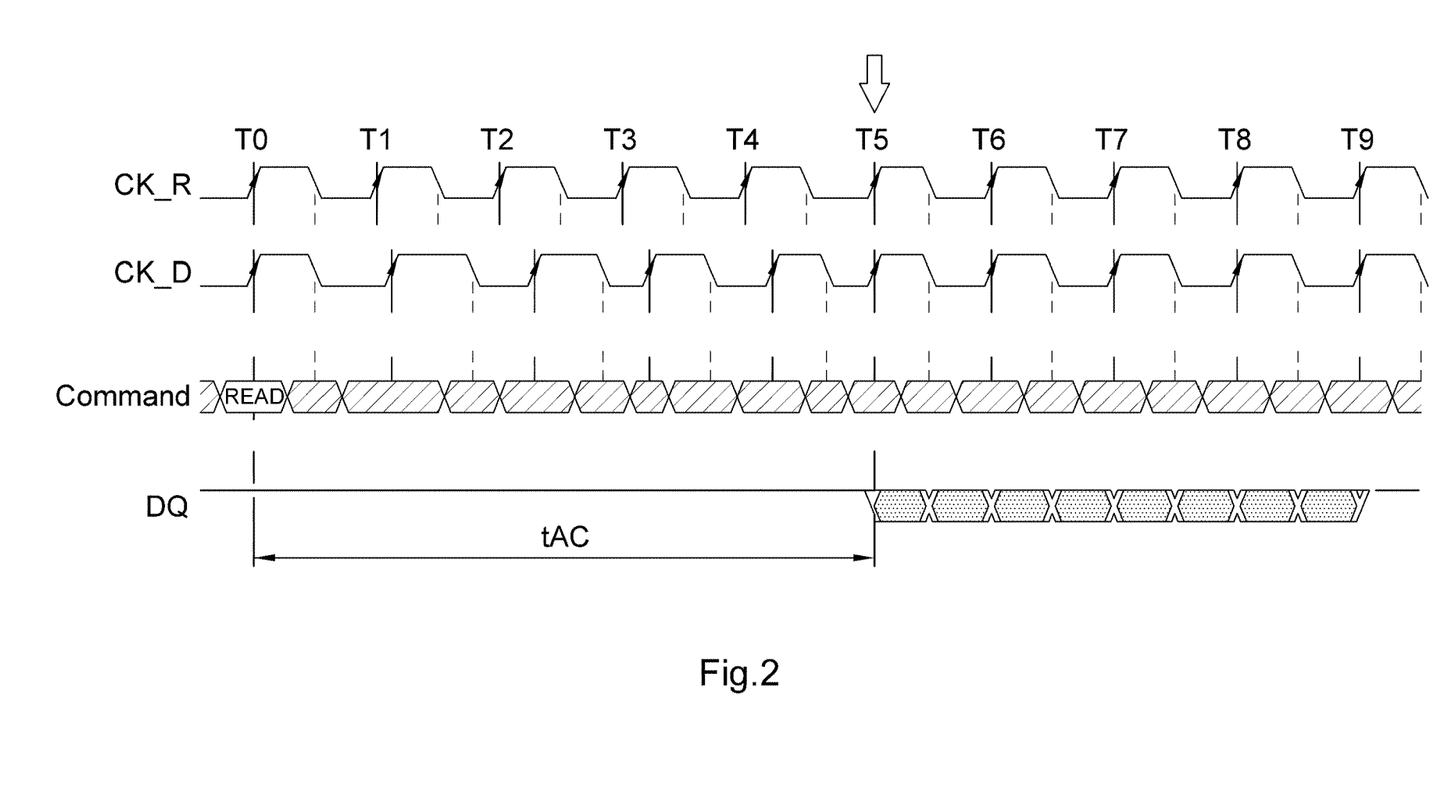
FIG. 2 is a timing diagram of the control circuit in FIG. 1 that illustrates the relationship between the CLK_R, CLK_B and DQ after the DRAM receives a READ command.

FIG. 2 is a timing diagram of the control circuit in FIG. 1 that illustrates the relationship between the CLK_R, CLK_B and DQ after the DRAM receives a READ command. After the DRAM receives the READ command, the DRAM starts a READ operation. To prevent jitter from occurring in the output data (DQ) accessed from the DRAM, the filter 14 only activates the DLL 10 to update the delay line when an edge of the CLK_B is detected continuously ahead of or continuously behind an edge of the CLK_R. More specifically, the edge of the CLK_B should be detected four times continuously ahead of or continuously behind the edge of the CLK_R (at cycles T1~T4). The DRAM outputs the DQ after the read latency (RL, which is usually a few clock cycles) of the CLK_B. A problem occurs when a skew between the CLK_B and the CLK_R is generated because the voltage level of the clock tree 11 drops slowly during the READ operation. However, the skew may exist or become even larger before the DLL 10 is activated by the filter 14. As a result, the access time (tAC) of the DRAM becomes longer, and thus the tAC is equal to the number of the CLK_B. To solve this problem, increasing the width of the clock tree power bus or adding a large capacitor to the clock tree power bus may serve as solutions, but the area of the DRAM may also increase.

SUMMARY

The present invention therefore aims to provide a control circuit and a control method for the DRAM to control the DLL, wherein when a PD detects that a READ command is received, the filter increases the number of activations for the DLL to update the delay line. The jitter in the output data is not considered until the output data is ready to be sent out, so that the skew between the calibrated clock and the reference clock can be effectively eliminated, thereby shortening the access time of the DRAM.

The present invention provides a control circuit for controlling a DLL in a DRAM, the control circuit comprising: a DLL receiving an reference clock and updating a delay line, and then outputting a calibrated clock via a clock tree; a PD receiving the calibrated clock via the clock tree and detecting a phase difference between the calibrated clock and the reference clock; and a filter activating the DLL to update the delay line according the phase difference, wherein when a READ command is received, the filter increases the number of activations for the DLL to update the delay line.

The present invention also provides a control method for controlling a DLL in a DRAM, the method comprising: receiving, by the DLL, an reference clock; updating, by the DLL, a delay line; outputting, by the DLL via a clock tree, a calibrated clock; receiving, by a PD via the clock tree, the calibrated clock outputted by the DLL; detecting, by the PD, a phase difference between the calibrated clock and a reference clock; and activating, by a filter, the DLL to update the delay line according the phase difference, wherein when a READ command is received, the filter increases the number of activations for the DLL to update the delay line.

BRIEF DESCRIPTION OF THE DRAWINGS

The present invention can be more fully understood by reading the subsequent detailed description and examples with reference made to the accompanying drawings.

DETAILED DESCRIPTION

The decryption is made for the purpose of illustrating the general principles of the present invention and should not be taken in a limiting sense.

The present invention provides a control circuit and a method in order to increase the number of activations for the DLL to update the delay line after a READ command is received and before the DQ is prepared.

Figure 3:
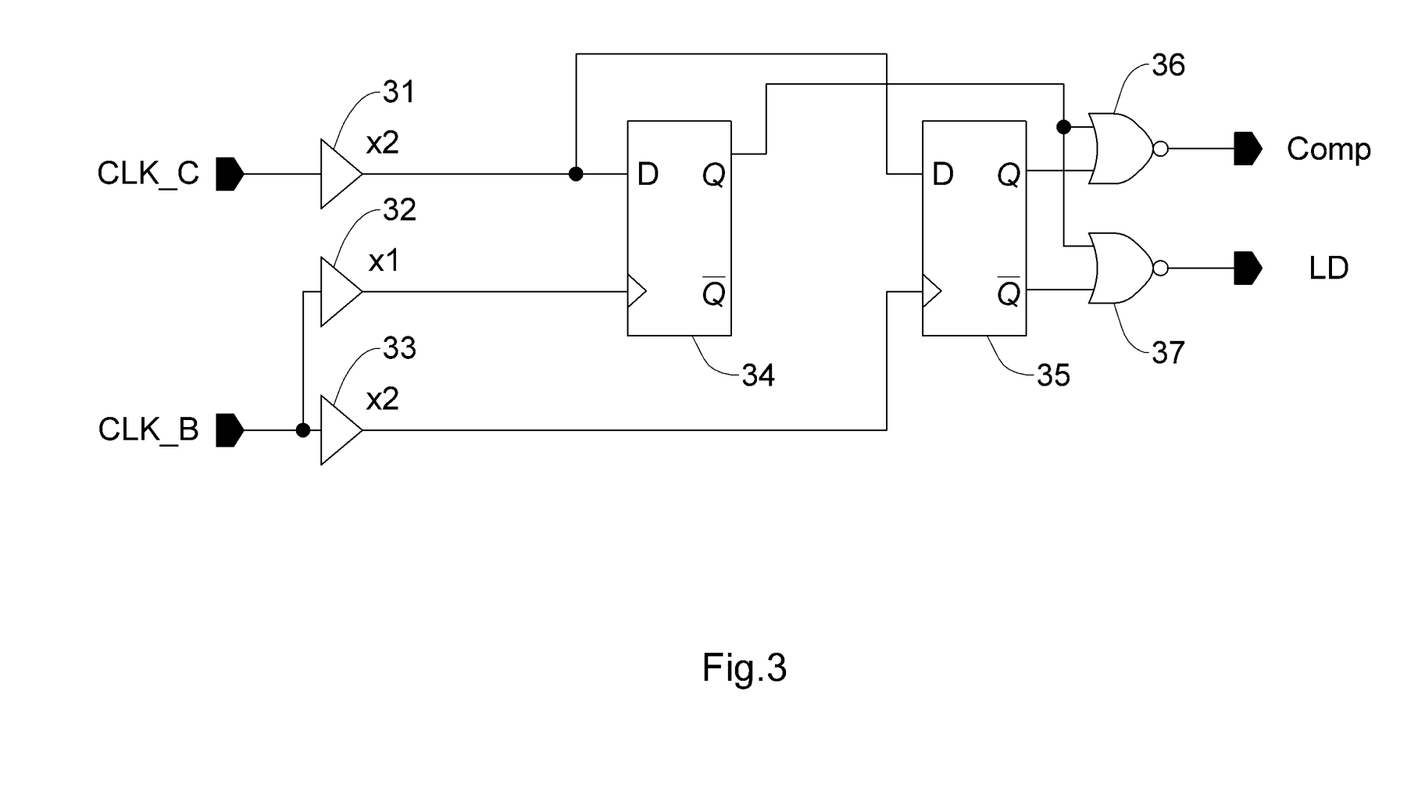
FIG. 3 illustrates a PD with a decision module in accordance with an exemplary embodiment of the present invention.
Figure 4:
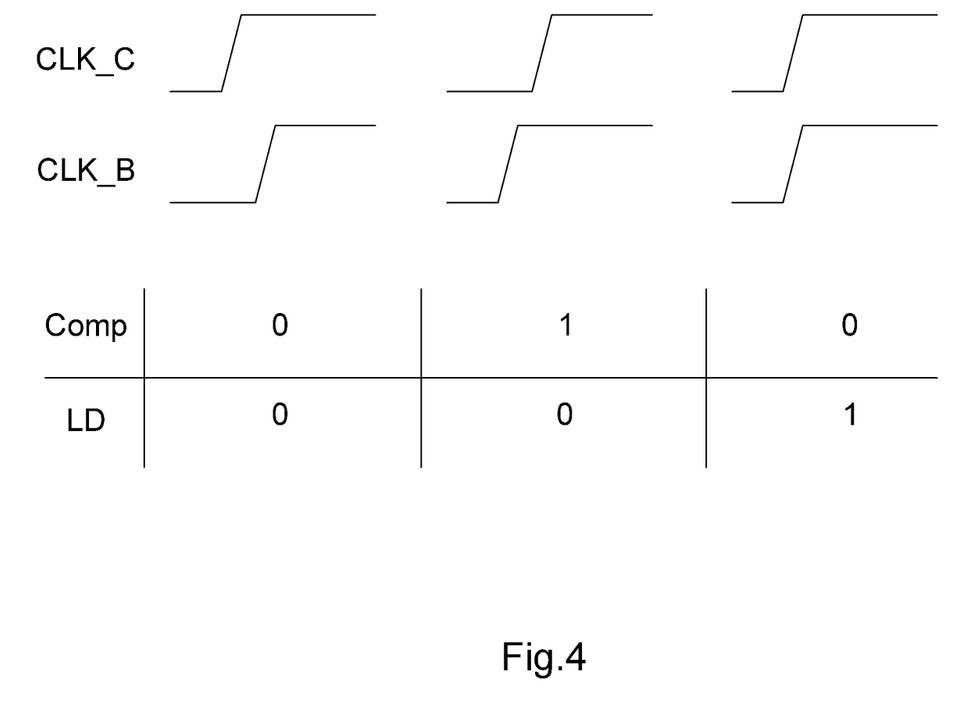
FIG. 4 illustrates a waveform and an output table that are useful for understanding the operation of the PD in FIG. 3.

FIG. 3 illustrates a PD in accordance with an exemplary embodiment of the present invention. FIG. 4 illustrates a waveform and an output table that are useful for understanding the operation of the PD in FIG. 3. The PD is able to detect the relationship between an edge of the CLK_B and an edge of the CLK_R, and then obtain the information that an edge of the CLK_B is ahead of, behind or synchronized with the CLK_R. Next, in the present invention, based on the information, the filter activates the DLL to update the delay line according to the relationship between an edge of the CLK_B and an edge of the CLK_R. Furthermore, the present invention further includes a function that detects if the READ command is received and if the DQ is already prepared, and then generates a signal to lock or unlock the filter.

FIG. 3 does not intend to limit the schematic of the PD. It should be understood by one skilled in the art that any schematic of the circuit able to achieve the function of the truth table should fall within the scope of the present invention.

In one embodiment of the present invention, the PD includes a decision module, and when the decision module detects that a READ command is received, the PD locks the filter, which is then set to a disabled state. Therefore, the filter increases the number of activations for the DLL to update the delay line. In one embodiment of the present invention, the filter activates the DLL every clock cycle. The PD then unlocks the filter in the disabled state when output data according to the READ command is prepared.

Figure 5A:
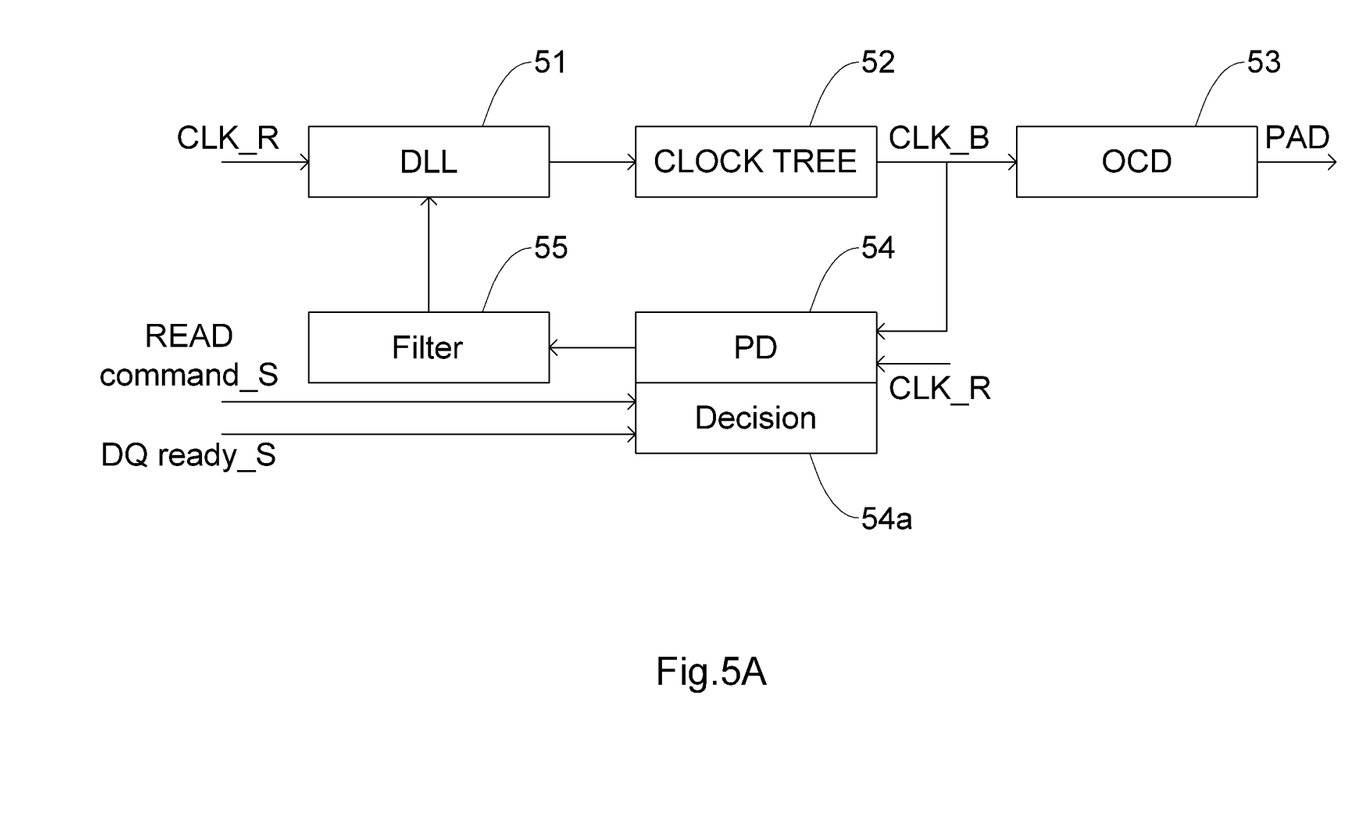
FIG. 5A illustrates a control circuit for controlling a DLL in a DRAM in accordance with an exemplary embodiment of the present invention.

FIG. 5A is a control circuit for controlling a DLL 51 in a DRAM in accordance with an exemplary embodiment of the present invention. The DRAM includes the DLL 51, a clock tree 52, an OCD 53, a PD 54 and a filter 55. The DLL 51 includes a delay line which consists of delay devices; thus, by updating the voltage, RC value of the delay devices or the number of the delay device of the delay line, the added delay time of the DLL 51 can be adjusted. The DLL 51 receives a CLK_R and updates a delay line of the DLL 51, and then outputs a CLK_B synchronized with the CLK_R via the clock tree 52. As such, the control signal of the DRAM used for controlling an access memory can be synchronized with the CLK_R. In one embodiment of the present invention, the DLL 51 transmits the CLK_B to at least one OCD 53 via the clock tree 52 with a transmission path similar to each path, and each one of the transmission paths has thus a similar RC delay time.

The PD 54 receives the CLK_B via the clock tree 52, detects a phase difference between the CLK_B and the CLK_R, and then outputs the information as to whether any skew between the CLK_R and the CLK_B exists and whether the READ command is received by the DLL 51. In one embodiment of the present invention, the PD 54 further includes a decision module 54a. The DRAM transmits a READ command received signal (READ command_S) and a DQ prepared signal (DQ ready_S) to the decision module 54a, so as to notify the decision module 54a that the READ command is received by the DRAM and that the DQ is prepared by the DRAM.

Before the decision module 54a receives the READ command_S, the filter 55 is set to an enabled state and activates the DLL 51 to update the delay line according the phase difference. For example, the filter 55 activates the DLL 51 to update the delay line when an edge of the calibrated clock is detected continuously ahead of or continuously behind an edge of the reference clock in a number of times by the PD 54, such as four times. When the decision module 54a detects the READ command_S, the PD 54 locks the filter 55, which is then set to a disabled state to activate the DLL 51 to update the delay line every clock cycle or every few cycles. Next, when the decision module 54a detects the DQ ready_S, the PD 54 unlocks the filter 55 in the disabled state, and thus the filter 55 is set back to the enabled state.

Figure 5B:
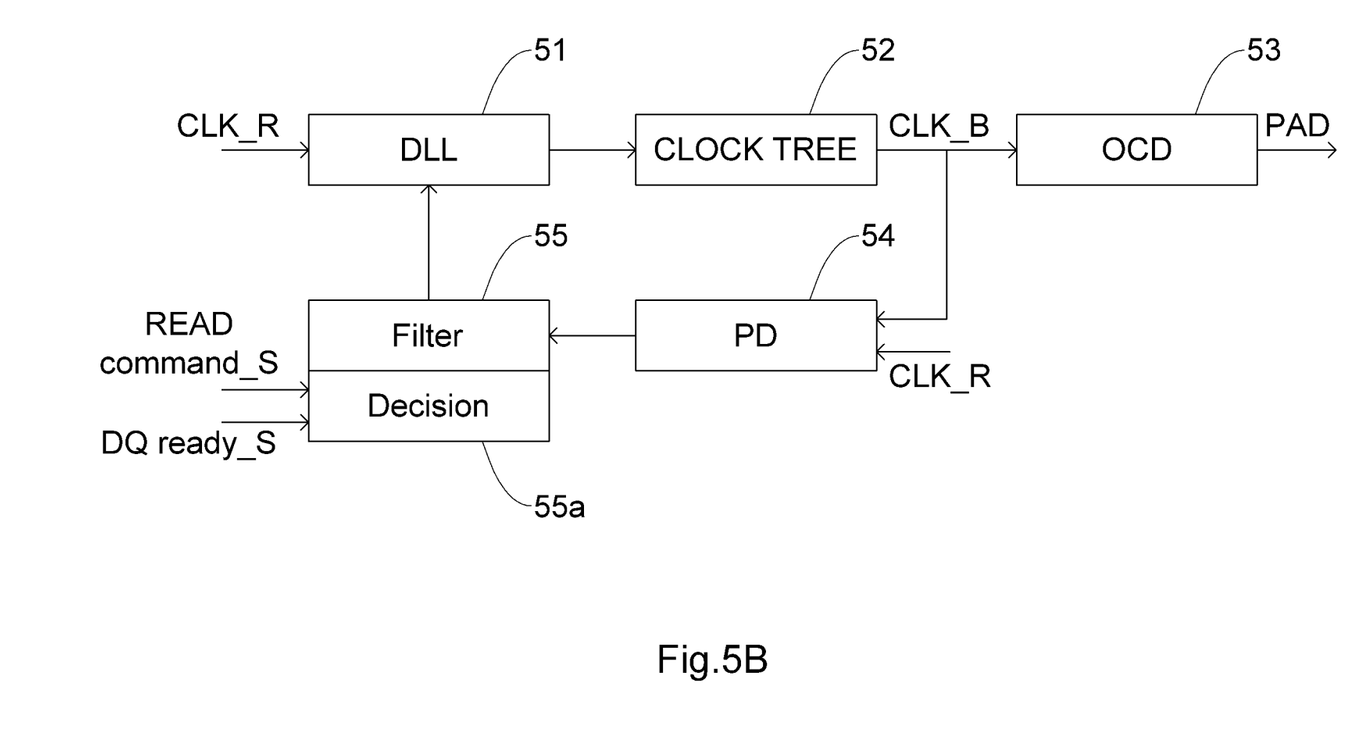
FIG. 5B is another control circuit for controlling a DLL 51 in a DRAM in accordance with an exemplary embodiment of the present invention.

FIG. 5B is another control circuit for controlling a DLL 51 in a DRAM in accordance with an exemplary embodiment of the present invention. The filter 55 further includes a decision module 55a. The DRAM transmits a READ command received signal (READ command_S) and the DQ prepared signal (DQ ready_S) to the decision module 55a, so as to notify the decision module 55a that the READ command is received and that the DQ is prepared.

Before the decision module 55a receives the READ command_S, the filter 55 is set to an enabled state, and the filter 55 activates the DLL 51 to update the delay line according the phase difference. For example, the filter 55 activates the DLL 51 to update the delay line when an edge of the calibrated clock is detected continuously ahead of or continuously behind an edge of the reference clock in a number of times by the PD 54, such as four times. When the decision module 55a detects the READ command_S, the filter 55 is locked and then set to a disabled state to activate the DLL 51 to update the delay line every clock cycle or every few cycles. Next, when the decision module 55a detects the DQ ready_S, the filter 55 in the disabled state is unlocked and thus set back to the enabled state.

Figure 6:
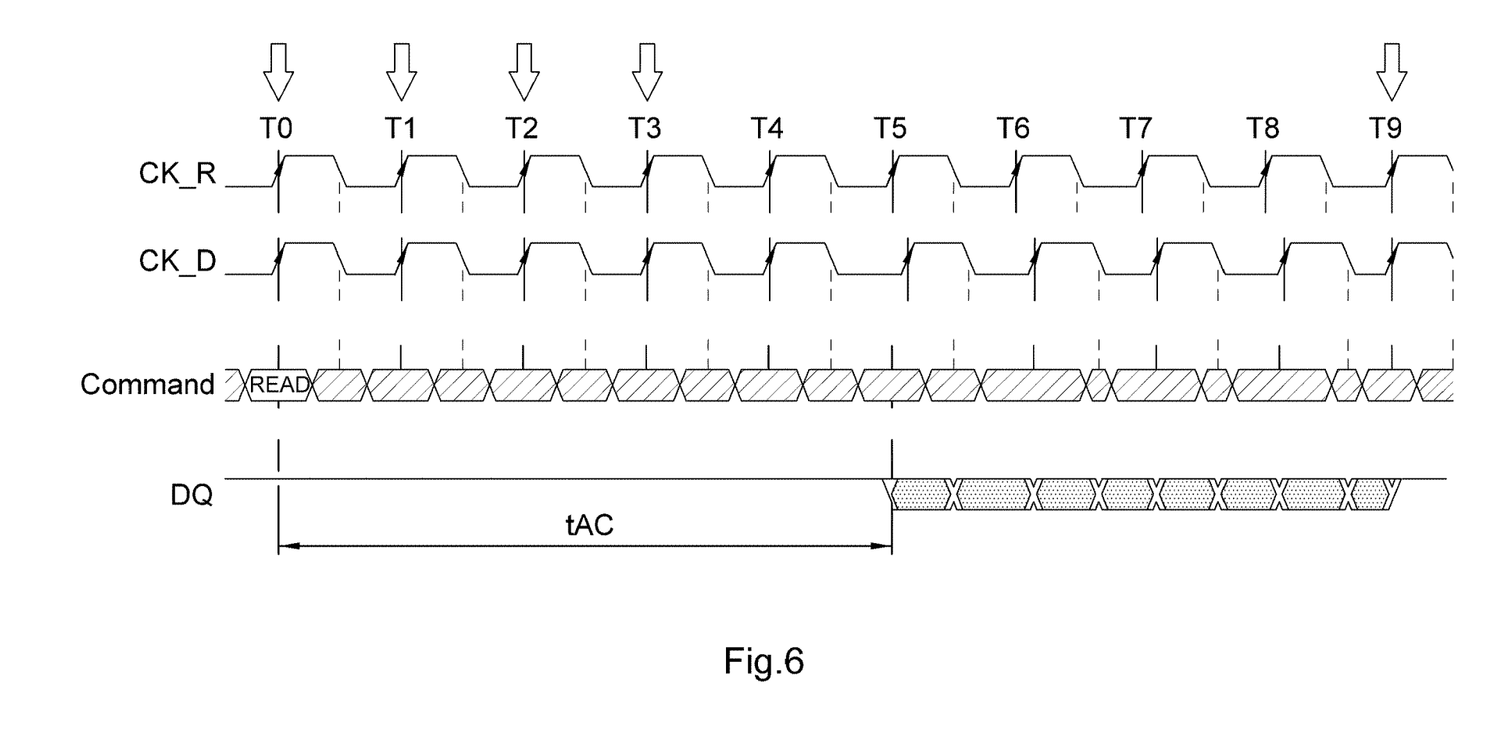
FIG. 6 is a timing diagram of the control circuit in FIG. 5 that illustrates the relationship between the CLK_R, CLK_B and DQ after the DRAM receives a READ command.
Figure 7:
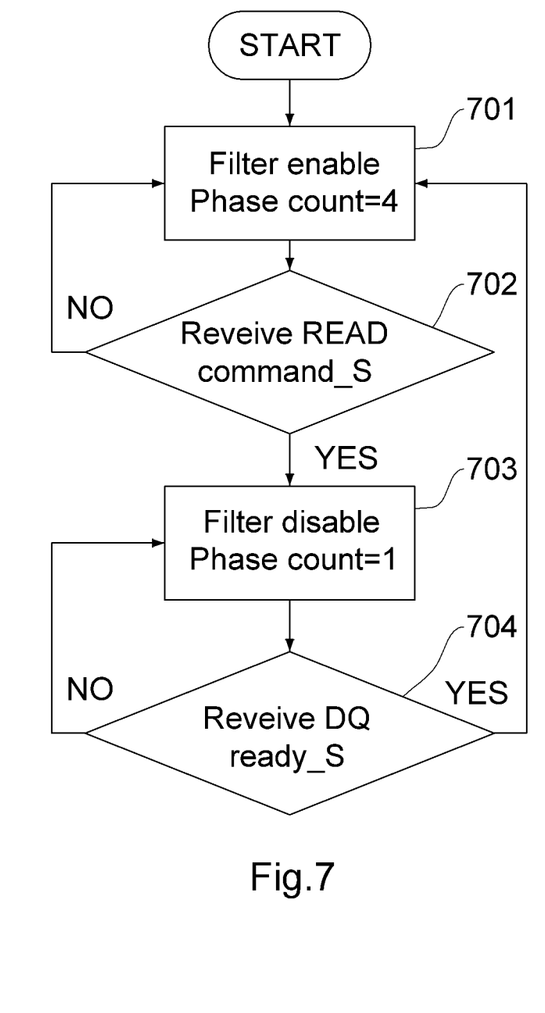
FIG. 7 is a flow chart of a control method for controlling a DLL in a DRAM in accordance with an exemplary embodiment of the present invention.

FIG. 6 is a timing diagram of the control circuit in FIG. 5 that illustrates the relationship between the CLK_R, CLK_B and DQ after the DRAM receives a READ command. Moreover, FIG. 7 is a flow chart of a control method for controlling a DLL 51 in a DRAM in accordance with an exemplary embodiment of the present invention. The READ operation of the present invention may be easier to understand by referring to FIGS. 6 and 7 at the same time.

Initially, the filter 55 is set to the enabled state, and when an edge of the CLK_B is detected continuously ahead of or continuously behind an edge of the CLK_R in four times by the PD 54 (at step 701 in FIG. 7). The CLK_B will synchronize with the CLK_R after the DLL 51 updates the delay line (indicated by white arrows). When the decision module 54a or 55a detects the READ command_S (at cycle T0 of FIG. 6 and at step 702 in FIG. 7), the filter 55 is set to the disabled state and increases the number of activations for the DLL 51 to update the delay line. Preferably, the filter 55 activates the DLL 51 to update the delay line every clock cycle (at cycles T0~T3 in FIG. 6 and at step 703 in FIG. 7), thereby minimizing the access time (tAC) of the DRAM.

Next, when the decision module 54a or 55a detects the DQ ready_S, the filter 55 is set to the enabled state (at cycle T4 in FIG. 6 and at step 704 in FIG. 7). Therefore, the filter 55 goes back to activate the DLL 51 to update the delay line when an edge of the calibrated clock is detected continuously ahead of or continuously behind an edge of the reference clock in four times by the PD 54 (at cycles T5~T9 in FIG. 6 and at step 701 in FIG. 7).

While the present invention has been described in connection with exemplary embodiments thereof, one skilled in the art will recognize that many modifications and variations are intended to be within the scope of the present invention, and the above description will not limit the scope thereof.

What is claimed is:

1. A control circuit for controlling a delay lock loop (DLL) in a dynamic random access memory (DRAM), comprising:
   a DLL receiving a reference clock and updating a delay line, and then outputting a calibrated clock via a clock tree;
   a phase detector (PD) receiving the calibrated clock via the clock tree and detecting a phase difference between the calibrated clock and the reference clock; and
   a filter activating the DLL to update the delay line according to the phase difference,
   wherein when a READ command is received, the filter increases the number of activations for the DLL to update the delay line.

2. The control circuit of claim 1, wherein the filter activates the DLL to update the delay line every clock cycle.

3. The control circuit of claim 1, wherein the DLL transmits the calibrated clock to at least one off-chip driver (OCD) via the clock tree with a transmission path similar to each path.

4. The control circuit of claim 1, wherein the PD includes a decision module, and when the decision module detects that the READ command is received, the PD locks the filter, which is then set to a disabled state to activate the DLL to update the delay line every clock cycle.

5. The control circuit of claim 4, wherein the PD unlocks the filter in the disabled state when output data is prepared according to the READ command.

6. The control circuit of claim 5, wherein the filter activates the DLL to update the delay line when an edge of the calibrated clock is detected continuously ahead of or continuously behind an edge of the reference clock in a number of times by the PD.

7. The control circuit of claim 1, wherein the filter includes a decision module, and when the decision module detects that the READ command is received, the filter is then set to a disabled state to activate the DLL to update the delay line every clock cycle.

8. The control circuit of claim 7, wherein the filter is set to the enabled state when output data is prepared according to the READ command.

9. The control circuit of claim 8, wherein the filter activates the DLL to update the delay line when an edge of the calibrated clock is detected continuously ahead of or continuously behind an edge of the reference clock in a number of times by the PD.

10. A control method for controlling a delay lock loop (DLL) in a dynamic random access memory (DRAM), the method comprising:
    receiving, by the DLL, a reference clock;
    updating, by the DLL, a delay line;
    outputting, by the DLL via a clock tree, a calibrated clock;
    receiving, by a phase detector (PD) via the clock tree, the calibrated clock outputted by the DLL;
    detecting, by the PD, a phase difference between the calibrated clock and the reference clock; and
    activating, by a filter, the DLL to update the delay line according the phase difference, wherein when a READ command is received, the filter increases the number of activations times for the DLL to update the delay line.

11. The control method of claim 10, wherein the filter activates the DLL to update the delay line every clock cycle.

12. The control method of claim 10, wherein the DLL transmits the calibrated clock to at least one off-chip driver (OCD) via the clock tree with a transmission path similar to each path.

13. The control method of claim 10, wherein the PD locks the filter, which is then set to a disabled state to activate the DLL every clock cycle, when the PD detects that the READ command is received.

14. The control method of claim 12, wherein the PD unlocks the filter in the disabled state when output data is prepared according to the READ command.

15. The control method of claim 13, wherein the filter activates the DLL to update the delay line when the PD detects an edge of the calibrated clock continuously ahead of or continuously behind an edge of the reference clock in a number of times.

16. The control method of claim 10, wherein the filter is then set to a disabled state to activate the DLL every clock cycle, when the filter detects that the READ command is received.

17. The control method of claim 12, wherein the filter is set to the enabled state when output data is prepared according to the READ command.

18. The control method of claim 13, wherein the filter activates the DLL to update the delay line when the PD detects an edge of the calibrated clock continuously ahead of or continuously behind an edge of the reference clock in a number of times.

* * * * *